US012777830B2

(12) United States Patent
Huang et al.

(10) Patent No.: US 12,777,830 B2
(45) Date of Patent: Oct. 27, 2026

(54) THIN FILM TRANSISTOR, MANUFACTURING METHOD THEREOF, AND ARRAY SUBSTRATE

(71) Applicant: BOE TECHNOLOGY GROUP CO., LTD., Beijing (CN)

(72) Inventors: Jie Huang, Beijing (CN); Ce Ning, Beijing (CN); Zhengliang Li, Beijing (CN); Hehe Hu, Beijing (CN); Nianqi Yao, Beijing (CN); Kun Zhao, Beijing (CN); Tianmin Zhou, Beijing (CN); Liping Lei, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 1000 days.

(21) Appl. No.: 17/996,260

(22) PCT Filed: Nov. 3, 2021

(86) PCT No.: PCT/CN2021/128401
§ 371 (c)(1),
(2) Date: Oct. 14, 2022

(87) PCT Pub. No.: WO2022/247148
PCT Pub. Date: Dec. 1, 2022

(65) Prior Publication Data

US 2024/0222445 A1 Jul. 4, 2024

(30) Foreign Application Priority Data

May 28, 2021 (CN) ........................ 202110591152.3

(51) Int. Cl.
*H10D 30/67* (2025.01)
*H10D 30/01* (2025.01)
(Continued)

(52) U.S. Cl.
CPC ........... *H10K 71/00* (2023.02); *H10D 30/031* (2025.01); *H10D 30/6729* (2025.01);
(Continued)

(58) Field of Classification Search
CPC ........ H10D 30/67–6759; H10D 30/031–0327; H10D 86/021–0251; H10D 30/6755;
(Continued)

(56) References Cited

U.S. PATENT DOCUMENTS

| | | | |
|---|---|---|---|
| 10,008,614 | B1 | 6/2018 | He et al. |
| 2016/0005870 | A1 | 1/2016 | Huang et al. |

(Continued)

FOREIGN PATENT DOCUMENTS

| | | | |
|---|---|---|---|
| CA | 105470310 | A | 4/2016 |
| CN | 102184968 | A | 9/2011 |

(Continued)

OTHER PUBLICATIONS

Chinese Office Action dated May 14, 2024, cited in Chinese Application No. 202110591152.3, with English translation. (27 pages).

(Continued)

*Primary Examiner* — Moin M Rahman
(74) *Attorney, Agent, or Firm* — LEASON ELLIS LLP

(57) ABSTRACT

A thin film transistor, an array substrate and a manufacturing method of the thin film transistor are provided, the thin film transistor includes a base substrate; and a first active layer, a first insulating layer and a second active layer, which are sequentially arranged on the base substrate, the first active layer is in contact with the second active layer through a first via hole structure located in the first insulating layer, and non-contacted portions of the first active layer and the second active layer are separated by the first insulating layer, the thin film transistor has a plurality of active layer struc- (Continued)

tures, so that the charges are gathered on two surfaces of each of the active layers, and the number of the charges gathered on the surfaces of the active layers is multiplied, and the open state current of the thin film transistor is multiplied.

10 Claims, 9 Drawing Sheets

(51) Int. Cl.
*H10K 10/40* (2023.01)
*H10K 71/00* (2023.01)

(52) U.S. Cl.
CPC ....... *H10D 30/673* (2025.01); *H10D 30/6733* (2025.01); *H10K 10/40* (2023.02)

(58) Field of Classification Search
CPC .. H10D 86/423; H10D 86/60; H10D 86/0221; H10D 64/62; H10D 62/80; H10D 86/0231; H10D 99/00; H10D 30/6713; H10D 30/6728; H10D 86/40; H10D 30/6729; H10D 30/673; H10D 30/6733; H10D 30/021; H10D 62/10; H10D 62/17; H10D 86/00; H10D 62/124; H10D 62/235; H10D 86/421; H10D 30/6757; H10K 10/46–491; H10K 59/1213; H10K 59/1201; H10K 59/124; H10K 59/122; H10K 50/30; H10K 19/10; H10K 59/125; H10K 10/481–482; H10K 10/464; H10K 10/466; H10K 10/84; H10K 71/00; H10K 10/40; H10K 71/16; C23C 14/35; G02F 1/1343; G02F 1/13363; G03F 5/16; H10P 10/00
See application file for complete search history.

(56) References Cited

U.S. PATENT DOCUMENTS

| | | | | |
|---|---|---|---|---|
| 2016/0163881 | A1 | 6/2016 | Shi et al. | |
| 2016/0343877 | A1* | 11/2016 | Shi | H10D 30/0316 |
| 2018/0374874 | A1 | 12/2018 | Cao et al. | |
| 2019/0165004 | A1* | 5/2019 | Lou | H10D 99/00 |
| 2020/0119117 | A1* | 4/2020 | Kim | H10D 86/60 |
| 2021/0202757 | A1 | 7/2021 | Wang et al. | |
| 2021/0336068 | A1 | 10/2021 | Zhang et al. | |
| 2023/0061581 | A1* | 3/2023 | Ko | H10D 86/60 |

FOREIGN PATENT DOCUMENTS

| | | | |
|---|---|---|---|
| CN | 103456744 | A | 12/2013 |
| CN | 103500764 | A | 1/2014 |
| CN | 103592801 | A | 2/2014 |
| CN | 104465788 | A | 3/2015 |
| CN | 106409845 | A | 2/2017 |
| CN | 106935657 | A | 7/2017 |
| CN | 108400139 | A | 8/2018 |
| CN | 109686794 | A | 4/2019 |
| CN | 109817645 | A | 5/2019 |
| CN | 110190066 | A | 8/2019 |
| CN | 110797356 | A | 2/2020 |
| CN | 111081781 | A | 4/2020 |
| KR | 1020150033772 | A | 4/2015 |
| WO | 2020060891 | A1 | 3/2020 |

OTHER PUBLICATIONS

Chinese Office Action cited in related Chinese Application No. 202110591152.3, dated Aug. 21, 2024, with English Translation. 25 pages.

* cited by examiner

THIN FILM TRANSISTOR, MANUFACTURING METHOD THEREOF, AND ARRAY SUBSTRATE

CROSS-REFERENCE TO PATENT APPLICATIONS

The present application is a U.S. National Stage application under 35 U.S.C. § 371 of International Application No. PCT/CN2021/128401, filed on Nov. 3, 2021, which claims the priority of Chinese patent application No. 202110591152.3 filed on May 28, 2021, both of which are incorporated by reference in their entireties.

TECHNICAL FIELD

The embodiments of the present disclosure relate to a thin film transistor, an array substrate and a manufacturing method of the thin film transistor.

BACKGROUND

Thin film transistors can be divided into a top-gate structure type and a bottom-gate structure type according to the relative positions of a gate electrode and an active layer, and can be divided into a top-contact structure and a bottom-contact structure according to the position of source-drain electrode layer relative to active layer. That is, thin film transistors include four structures, including: a bottom-gate top-contact type, a bottom-gate bottom-contact type, a top-gate top-contact type and a top-gate bottom-contact type.

Thin film transistors include silicon-based thin film transistors, metal oxide thin film transistors and organic thin film transistors. Silicon-based thin film transistors are widely used in display panels because of their good performance and large-area fabrication. With the development of display technology, the inherent shortcomings of the silicon-based thin film transistors, such as low mobility and poor stability of amorphous silicon thin film transistors, poor uniformity and high cost of polysilicon thin film transistors, make it difficult for the silicon-based thin film transistors to meet the development requirements. Although the organic thin film transistors can effectively reduce the cost, their performance is far from meeting the requirements of display technology. Compared with silicon-based thin film transistors, metal oxide thin film transistors have obvious technical advantages, such as higher mobility, steeper sub-threshold swing, smaller off-state leakage current, better device performance consistency, simple process for manufacturing the metal oxide semiconductors, low process temperature, good stability, high visible light transmittance of the formed metal oxide thin film transistors, and no obvious degradation of the characteristics of the metal oxide thin film transistors in the bending state.

SUMMARY

At least one embodiment of the present disclosure provides a thin film transistor, and the thin film transistor includes a base substrate; and a first active layer, a first insulating layer and a second active layer, which are sequentially arranged on the base substrate; in which the first active layer is in contact with the second active layer through a first via hole structure located in the first insulating layer, and non-contacted portions of the first active layer and the second active layer are separated by the first insulating layer.

For example, the thin film transistor provided by at least one embodiment of the present disclosure, further includes a source-drain electrode layer, in which the source-drain electrode layer is electrically connected with the first active layer and the second active layer.

For example, in the thin film transistor provided by at least one embodiment of the present disclosure, the source-drain electrode layer is electrically connected with the second active layer through a second via hole structure, an orthographic projection of the first via hole structure on the base substrate and an orthographic projection of the second via hole structure on the base substrate are at least partially overlapped, and at least a part of the source-drain electrode layer extends into the first via hole structure.

For example, the thin film transistor provided by at least one embodiment of the present disclosure, further includes a first gate electrode and a second gate electrode, in which the first gate electrode is at a side of the first active layer close to the base substrate, and a first gate insulating layer is arranged between the first gate electrode and the first active layer: the second gate electrode is at a side of the second active layer away from the base substrate, and a second gate insulating layer is arranged between the second gate electrode and the second active layer.

For example, in the thin film transistor provided by at least one embodiment of the present disclosure, an interlayer insulating layer is arranged at a side of the second gate electrode away from the base substrate, the source-drain electrode layer is arranged at a side of the interlayer insulating layer away from the base substrate, and the second via hole structure sequentially penetrates through the interlayer insulating layer, the second gate insulating layer and a part of the first insulating layer.

For example, the thin film transistor provided by at least one embodiment of the present disclosure, further includes a third active layer, in which the third active layer is arranged at a side of the second gate electrode away from the base substrate, the interlayer insulating layer is arranged between the third active layer and the second gate electrode, and the third active layer is electrically connected and with the source-drain electrode layer.

For example, the thin film transistor provided by at least one embodiment of the present disclosure, further includes a gate electrode, in which the gate electrode is between the first active layer and the second active layer.

For example, in the thin film transistor provided by at least one embodiment of the present disclosure, a gate insulating layer is arranged at a side of the gate electrode away from the first insulating layer, and the first via hole structure penetrates through both the first insulating layer and the gate insulating layer.

For example, in the thin film transistor provided by at least one embodiment of the present disclosure, a second insulating layer is arranged between the second active layer and the source-drain electrode layer, and the second via hole structure penetrates through the second insulating layer.

For example, in the thin film transistor provided by at least one embodiment of the present disclosure, the source-drain electrode layer and the second gate electrode are arranged on a same layer, an interlayer insulating layer is arranged at a side of the second gate electrode close to the base substrate, and the second via hole structure sequentially penetrates through the interlayer insulating layer, the second gate insulating layer and a part of the first insulating layer.

For example, in the thin film transistor provided by at least one embodiment of the present disclosure, the first active layer comprises a first sub-active layer and a second sub-active layer which are stacked, and/or the second active layer comprises a third sub-active layer and a fourth sub-active layer which are stacked.

At least one embodiment of the present disclosure further provides an array substrate, and the array substrate includes any one of the thin film transistors mentioned above.

At least one embodiment of the present disclosure further provides a manufacturing method of a thin film transistor, and the manufacturing method includes: providing a base substrate; forming a first active layer on the base substrate: applying a first insulating film at a side of the first active layer away from the base substrate: patterning the first insulating layer film to form a first insulating layer with a first via hole structure; and forming a second active layer at a side of the first insulating layer away from the base substrate, in which the second active layer is in contact with the first active layer through the first via hole structure, and non-contacted portions of the first active layer and the second active layer are separated by the first insulating layer.

For example, the manufacturing method provided by at least one embodiment of the present disclosure, further includes forming a source-drain electrode layer, in which the source-drain electrode layer is electrically connected with the first active layer and the second active layer.

For example, in the manufacturing method provided by at least one embodiment of the present disclosure, the source-drain electrode layer is electrically connected with the second active layer through a second via hole structure, an orthographic projection of the first via hole structure on the base substrate and an orthographic projection of the second via hole structure on the base substrate are at least partially overlapped, and at least a part of the source-drain electrode layer extends into the first via hole structure.

For example, the manufacturing method provided by at least one embodiment of the present disclosure, further includes forming a first gate electrode at a side of the first active layer close to the base substrate: forming a first gate insulating layer between the first gate electrode and the first active layer: forming a second gate electrode at a side of the second active layer away from the base substrate: and forming a second gate insulating layer between the second gate electrode and the second active layer.

BRIEF DESCRIPTION OF THE DRAWINGS

In order to more clearly explain the technical solution of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

In order to make the purpose, technical scheme and advantages of the embodiments of the present disclosure clearer, the technical scheme of the embodiments of the present disclosure will be clearly and completely described below with reference to the drawings of the embodiments of the present disclosure. Obviously, the described embodiments are part of the embodiments of the present disclosure, but not all of them. Based on the described embodiments of the present disclosure, all other embodiments obtained by ordinary technicians in the field without creative labor are within the scope of protection of the present disclosure.

Unless otherwise defined, the technical terms or scientific terms used in the present disclosure shall have their ordinary meanings as understood by those with ordinary skills in the field to which this disclosure belongs. The words "first", "second" and the like used in the present disclosure do not indicate any order, quantity or importance, but are only used to distinguish different components. Similar words such as "comprising" or "comprise", "including" or "include" refer to that the elements or objects appearing before the word cover the listed elements or objects appearing after the word and their equivalents, without excluding other elements or objects. Words like "connected" or "connected" are not limited to physical or mechanical connections, but can include electrical connections, whether direct or indirect. "Up", "down", "left" and "right" are only used to express the relative positional relationship. When the absolute position of the described object changes, the relative positional relationship may also change accordingly.

Figure 1:
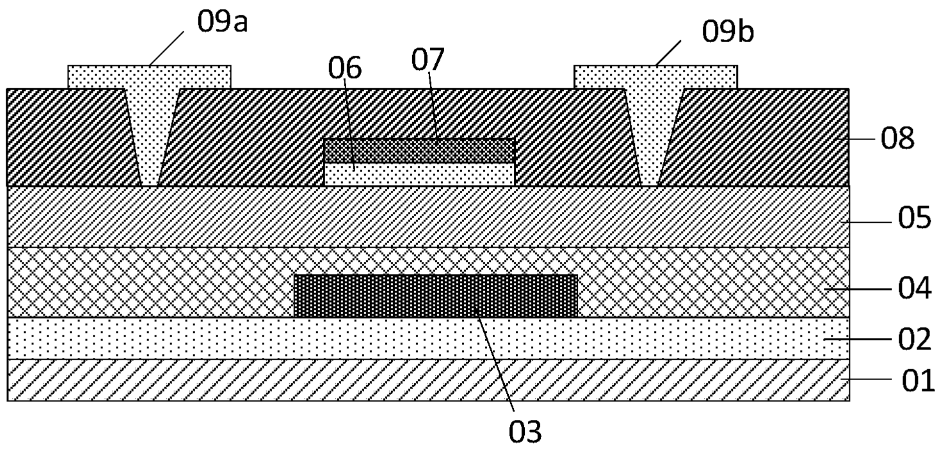
FIG. 1 is a schematic cross-sectional structure diagram of a thin film transistor.

Because the display panel is developing towards high resolution and large size, the thin film transistor in the display panel needs high on-state current. For example, FIG. 1 is a schematic cross-sectional structure diagram of a thin film transistor. As illustrated by FIG. 1, a buffer layer 02, a bottom gate electrode 03, a bottom gate insulating layer 04, an active layer 05, a top gate insulating layer 06, a top gate electrode 07, an insulating layer 08 and a source electrode 09*a*/a drain electrode 09*b* are sequentially stacked on a base substrate 01, that is, FIG. 1 shows a double-gate single active layer structure, and the bottom gate electrode 03 and the top gate electrode 07 used in the structure shown in FIG. 1 act on a same active layer 05, so as to improve the on-state current of the thin film transistor.

However, the structure shown in FIG. 1 still has the following defects: because only the bottom gate insulating layer 04, the top gate insulating layer 06 and the active layer 05 are provided between the top gate electrode 07 and the bottom gate electrode 03 for isolation; on the one hand, in a case that a distance between the top gate electrode 07 and the bottom gate electrode 03 is relatively close, it is easy to cause crosstalk between an electric field of the top gate electrode 07 and an electric field of the bottom gate electrode 03, which leads to the deterioration of the stability of carriers in the active layer 05 and makes the control of the characteristic of the thin film transistor difficult. For example, the voltage of the structure of the thin film transistor shown in FIG. 1 is easily changed by the voltage of the top gate electrode 07, and the positive and negative shift occurs, so that the characteristics of the thin film transistor are deteriorated; on the other hand, the thin film transistor shown in FIG. 1 can't double the on-state current, at present, the on-state current of the structure shown in FIG. 1 can only be increased by about 50%, and the thin film transistor shown in FIG. 1 has little improvement in the on-state current, thus, upon being applied to a display panel, the thin film transistor shown in FIG. 1 can't meet the requirements of the on-state current and the resolution of the display panel.

The inventor(s) of the present disclosure has noticed that thin film transistors with multiple active layers can be designed, so that charges are respectively accumulated on two surfaces of each of the active layers, so that the amount of charges accumulated on the surfaces of the active layers is multiplied, and then the on-state current of the thin film transistors is multiplied.

Figure 2:
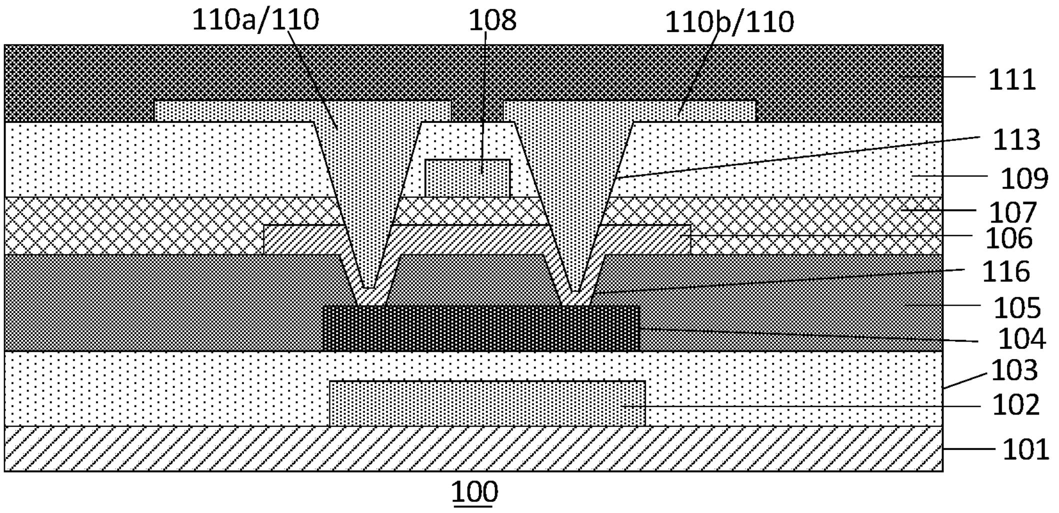
FIG. 2 is a schematic cross-sectional structure diagram of a thin film transistor provided by an embodiment of the present disclosure.

For example, FIG. 2 is a schematic cross-sectional structure diagram of a thin film transistor provided by an embodiment of the present disclosure. As illustrated by FIG. 2, the thin film transistor 100 includes a base substrate 101, and a first active layer 104, a first insulating layer 105 and a second active layer 106 which are sequentially stacked on the base substrate 101. The first active layer 104 is in contact with the second active layer 106 through a first via hole structure 116 located in the first insulating layer 105. Non-contacted portions of the first active layer 104 and the second active layer 106 are separated by the first insulating layer 105. For example, the first active layer 104 is in contact with the second active layer 106 through the first via hole structure 116 to realize the electrical connection between the first active layer 104 and the second active layer 106. The non-contacted portions of the first active layer 104 and the second active layer 106 are separated by the first insulating layer 105, so that both the surface of the first active layer 104 close to the base substrate 101 and the surface of the first active layer 104 close to the second active layer 106 are accumulated with charges, and both the surface of the second active layer 106 close to the base substrate 101 and the surface of the second active layer 106 away from the base substrate 101 are accumulated with charges. Therefore, the number of charges accumulated on the surface of the active layers (including the first active layer 104 and the second active layer 106) can be multiplied, and the on-state current can be multiplied.

For example, as illustrated by FIG. 2, the first active layer 104 is in contact with the second active layer 106 through the first via hole structure 116 located in the first insulating layer 105 to achieve electric connection.

For example, the number of the first via hole structures 116 may be one or more. In the cross-sectional structure of the thin film transistor shown in FIG. 2, the number of first via hole structures 116 is two, the two of the first via hole structures 116 are spaced apart from each other, and a sum of widths of edges of the two first via hole structures 116 close to the base substrate 101 is smaller than a maximum horizontal width of the first active layer 104 and smaller than a maximum horizontal width of the second active layer 106.

For example, a side of each of the first via hole structures 116 close to the base substrate 101 and a sidewall defining the first via hole structure 116 are covered with the second active layer 106, and each of the first via hole structures 116 is not completely filled with the second active layer 106.

For example, as illustrated by FIG. 2, an orthographic projection of each of the first via hole structures 116 on the base substrate 101 is smaller than an orthographic projection of the first active layer 104 on the base substrate 101, and smaller than an orthographic projection of the second active layer 106 on the base substrate 101. A sum of orthographic projections of a plurality of first via hole structures 116 on the base substrate 101 is smaller than the orthographic projection of the first active layer 104 on the base substrate 101 and smaller than the orthographic projection of the second active layer 106 on the base substrate 101. Of course, the embodiment of the present disclosure is not limited thereto, and the orthographic projection of each of the first via hole structures 116 on the base substrate 101 may be greater than or equal to the orthographic projection of the first active layer 104 on the base substrate 101.

For example, the material of the first active layer 104 and the material of the second active layer 106 may be the same or different. The material of the first active layer 104 and the material of the second active layer 106 may be silicon-based material, metal oxide semiconductor material, or organic semiconductor material. The material of the first active layer 104 is one of a silicon-based material, a metal oxide semiconductor material and an organic semiconductor material, and the material of the second active layer 106 is one of the other two materials different from the material of the first active layer 104.

For example, in the case that both the material of the first active layer 104 and the material of the second active layer 106 are the metal oxide semiconductor material, the metal oxide semiconductor material includes an n-type semiconductor material, such as: zinc oxide (ZnO), indium oxide ($In_2O_3$), indium zinc oxide (IZO), aluminum doped zinc oxide (AZO), boron doped zinc oxide (BZO), magnesium doped zinc oxide (MZO), zinc tin oxide (ZTO), indium gallium zinc oxide (IGZO), indium tin zinc oxide (ITZO), gallium zinc oxide (GZO), indium tin oxide (ITO), hafnium indium zinc oxide (HIZO) and tin oxide ($SnO_2$) and a p-type semiconductor material, such as tin protoxide (SnO) and cuprous oxide ($Cu_2O$). For example, the first active layer 104 and the second active layer 106 made of the metal oxide semiconductor material can be formed by magnetron sputtering, reactive sputtering, anodic oxidation or spin coating.

For example, the material of the first active layer 104 and the second active layer 106 may be silicon, germanium, silicon-germanium mixed material, etc. The first active layer 104 and the second active layer 106 made of the semiconductor material can be formed by magnetron sputtering or spin coating.

For example, the material of the first active layer 104 and the material of the second active layer 106 may also be organic semiconductor material, including pentacene, triphenylamine, fullerene, phthalein, polythiophene, polyaniline, polypyrrole, etc., and the organic semiconductor material may be formed by spin coating.

For example, a thickness of the first active layer 104 and a thickness of the second active layer 106 are in the range from 5 nm to 200 nm, respectively. For example, the thickness of the first active layer 104 may be 50 nm, 100 nm, 150 nm, or 200 nm, and the thickness of the second active layer 106 may be 50 nm, 100 nm, 150 nm, or 200 nm.

For example, the base substrate 101 is made of a rigid material or a flexible material. For example, the rigid material includes one of a rigid glass and a silicon wafer. The flexible material includes one of polyethylene naphthalate, polyethylene terephthalate, polyimide and a flexible glass.

For example, the material of the first insulating layer 105 includes one or more selected from the group consisting of silicon oxide, silicon nitride, aluminum oxide, hafnium oxide, tantalum oxide and zirconium oxide.

For example, the thickness of the first insulating layer 105 is in the range from 5 nm to 400 nm, such as 50 nm, 100 nm, 200 nm, 300 nm or 400 nm.

For example, as illustrated by FIG. 2, the thin film transistor 100 further includes a source-drain electrode layer 110, which is electrically connected with the first active layer 104 and the second active layer 106. The source-drain electrode layer 110 includes a source electrode 110*a* and a drain electrode 110*b*, both of the source electrode 110*a* and the drain electrode 110*b* are electrically connected to the first active layer 104 and the second active layer 106.

For example, the forms of electrical connection between the source-drain electrode layer 110 and the first active layer 104 and the second active layer 106 include: the source-drain electrode layer 110 is lapped with the first active layer 104, so that the source-drain electrode layer 110 is electrically connected with the first active layer 104 and the second active layer 106; the source-drain electrode layer 110 is lapped with the second active layer, so that the source-drain electrode layer 110 is electrically connected with the first active layer 104 and the second active layer 106; the source-drain electrode layer 110 is electrically connected with the first active layer 104 through the second via hole structure 113, so that the source-drain electrode layer 110 is electrically connected with both the first active layer 104 and the second active layer 106; the source-drain electrode layer 110 is electrically connected with the second active layer 106 through a second via hole structure 113 so that the source-drain electrode layer 110 is electrically connected with both the first active layer 104 and the second active layer 106.

For example, in the structure shown in FIG. 2, the source-drain electrode layer 110 is electrically connected with the second active layer 106 through the second via hole structure 113 so that the source-drain electrode layer 110 is electrically connected with both the first active layer 104 and the second active layer 106. An orthographic projection of the first via hole structure 116 on the base substrate 101 and an orthographic projection of the second via hole structure 113 on the base substrate 101 are at least partially overlapped with each other, and at least a part of the source-drain electrode layer 110 extends into the first via hole structure 116.

For example, a width of an edge of the first via hole structure 116 close to the base substrate 101 is larger than a width of an edge of the second via hole structure 113 close to the base substrate 101, and the edge of the second via hole structure 113 close to the base substrate 101 is sleeved in the first via hole structure 116, so that the source-drain electrode layer 110 can be electrically connected with the second active layer 106 more stably.

For example, the material of the source-drain electrode layer 110 may include one metal or a combination of more metals selected from the group consisting of molybdenum (Mo), chromium (Cr), titanium (Ti), aluminum (Al), aluminum alloy and copper (Cu).

For example, in an example, the material of the source-drain electrode layer 110 is copper-based metal. Copper has the characteristics of low resistivity and good conductivity, so it can improve the signal transmission rate of the source-drain electrode layer 110 (the source electrode 110*a* and the drain electrode 110*b*) and improve the display quality.

For example, the copper-based metal is copper (Cu) or a copper-based metal alloy with stable performance, such as copper-zinc alloy (CuZn), copper-nickel alloy (CuNi) and copper-zinc-nickel alloy (CuZnNi).

For example, a thickness of the source-drain electrode layer 110 may be in the range from 200 nm to 400 nm, for example, 200 nm, 230 nm, 250 nm, 300 nm, 350 nm, 380 nm and 400 nm.

For example, the source-drain electrode layer 110 is not limited to being formed at a side of the second active layer 106 away from the base substrate 101, but may also be formed at a side of the first active layer 104 close to the base substrate, or other positions, as long as the source-drain electrode layer 110 can be electrically connected with both the first active layer 104 and the second active layer 106.

For example, in the case that the first active layer 104 and the second active layer 106 are connected with each other, the resistance is high, and a dry etching process will be adopted upon the source-drain electrode layer 110 being formed, and a reducing gas is required when the dry etching process is performed; upon the material of the first active layer 104 and the material of the second active layer 106 being the metal oxide semiconductor material, the reducing gas can be used first to reduce the part of the second active layer 106 exposed to the second via hole structure 113 to a simple metal, so that the resistivity of the second active layer 106 is reduced, and then the overall resistance of the first active layer 104 and the second active layer 106 is reduced after they are electrically connected, that is, the resistance of the first active layer 104 and the second active layer 106 when they are connected can be reduced without adding new equipment and materials.

For example, as illustrated by FIG. 2, the thin film transistor 100 further includes a first gate electrode 102 and a second gate electrode 108; the first gate electrode 102 is at a side of the first active layer 104 close to the base substrate 101, a first gate insulating layer 103 is between the first gate electrode 102 and the first active layer 104; the second gate electrode 108 is at a side of the second active layer 106 away from the base substrate 101, and a second gate insulating layer 107 is between the second gate electrode 108 and the second active layer 106.

For example, the material of the first gate electrode 102 and the material of the second gate electrode 108 may respectively include one metal or a combination of more metals selected from the group consisting of molybdenum (Mo), chromium (Cr), titanium (Ti), aluminum (Al), aluminum alloy and copper (Cu). The material of the first gate electrode 102 and the material of the second gate electrode 108 may also include one or a combination of more transparent conductive materials selected from the group consisting of indium tin oxide (ITO), aluminum-doped zinc oxide (AZO) and boron-doped zinc oxide (BZO). Each of the first gate electrode 102 and the second gate electrode 108 may have a single-layer structure or a double-layer structure. The first gate electrode 102 and the second gate electrode

108 with the double-layer structure can be composite conductive layers composed of metal and transparent conductive materials, respectively.

For example, a thickness of the first gate electrode 102 and a thickness of the second gate electrode 108 may be in the range from 50 nm to 300 nm, respectively, for example, the thickness of the first gate electrode 102 may be 50 nm, 100 nm, 200 nm or 300 nm; the thickness of the second gate electrode 108 may be 50 nm, 100 nm, 200 nm or 300 nm.

For example, the first gate electrode made of the metal material can be formed by magnetron sputtering, electron beam evaporation or thermal evaporation, or the first gate electrode made of the transparent conductive material can be formed by magnetron sputtering or optical coating.

For example, the material of the first gate insulating layer 103 and the material of the second gate insulating layer 107 may be one or a combination of more selected from the group consisting of silicon oxide ($SiO_2$), silicon nitride ($SiN_x$), aluminum oxide ($Al_2O_3$), hafnium oxide ($HfO_2$), tantalum oxide ($Ta_2O_5$) and zirconium oxide ($ZrO_2$), respectively.

For example, a thickness of the first gate insulating layer 103 and a thickness of the second gate insulating layer 107 may be in the range from 5 nm to 400 nm, respectively. For example, the thickness of the first gate insulating layer 103 may be 50 nm, 100 nm, 150 nm, 200 nm, 250 nm or 300 nm, and the thickness of the second gate insulating layer 107 may be 50 nm, 100 nm, 150 nm, 200 nm or 200 nm.

For example, an oxide insulating material such as silicon oxide ($SiO_2$) or silicon nitride ($SiN_x$) can be deposited by plasma enhanced chemical vapor deposition (PECVD) to form the first gate insulating layer 103 and the second gate insulating layer 107, or the first gate insulating layer 103 and the second gate insulating layer 107 can be formed by spin-coating an organic insulating material.

For example, as illustrated by FIG. 2, an interlayer insulating layer 109 is arranged at a side of the second gate electrode 108 away from the base substrate 101, the source-drain electrode layer 110 is arranged at a side of the interlayer insulating layer 109 away from the base substrate 101, and the second via hole structure 113 sequentially penetrates through the interlayer insulating layer 109, the second gate insulating layer 107 and part of the first insulating layer 105.

For example, a first gate insulating layer 103, a first active layer 104, a first insulating layer 105, a second active layer 106 and a second gate insulating layer 107 are disposed between the first gate electrode 102 and the second gate electrode 108, so that the distance between the first gate electrode 102 and the second gate electrode 108 is relatively large, and the number of separated insulating films is relative large, so that the electric field of the first gate electrode 102 and the electric filed of the second gate electrode 108 are not easy to generate crosstalk.

For example, the structure of double gate electrodes and double active layers in FIG. 2 makes the on-state current of the thin film transistor double, and compared with forming two complete thin film transistors, one process step of forming the source-drain electrode layer is reduced, so that the number of mask plates as used is significantly reduced, thereby reducing the manufacturing cost, and the second gate insulating layer 107 and the interlayer insulating layer 109 are arranged between the second active layer 106 and the source-drain electrode layer 110. In this way, upon the source-drain electrode layer being formed, the second active layer 106 and the first active layer 104 will not be damaged by etching, so that the stability of the thin film transistor 100 is obviously improved. Meanwhile, because the first gate electrode 102 and the second gate electrode 108 control the first active layer 104 and the second active layer 106 respectively, the control ability of the first gate electrode 102 and the second gate electrode 108 is improved, so that the characteristics of the thin film transistor 101 can be guaranteed under the condition that the on-state current is doubled. Compared with the structure in FIG. 1, the on-state current of the thin film transistor in FIG. 2 is twice that of the thin film transistor in FIG. 1.

For example, as illustrated by FIG. 2, a passivation layer 111 is arranged at a side of the source-drain electrode layer 110 away from the base substrate 101, and the passivation layer 111 can prevent foreign impurities or water vapor from entering the thin film transistor 100, thereby affecting the performance of the thin film transistor.

Figure 3:
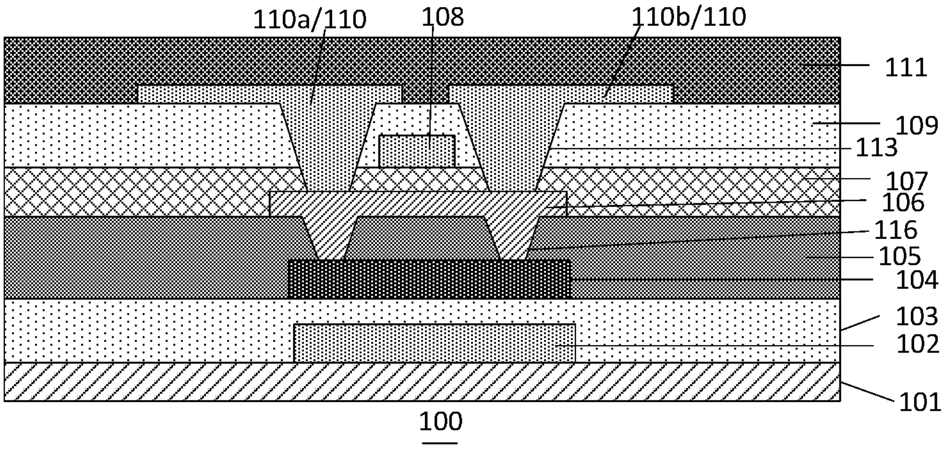
FIG. 3 is a schematic cross-sectional structure diagram of another thin film transistor provided by an embodiment of the present disclosure.

For example, FIG. 3 is a schematic cross-sectional structure diagram of another thin film transistor provided by an embodiment of the present disclosure. As illustrated by FIG. 3, the second via hole structure 113 penetrates through the interlayer insulating layer 109 and a part of the second gate insulating layer 107, and the source-drain electrode layer 110 is in direct contact with a surface of the second active layer 106 away from the base substrate 101 through the second via hole structure 113. The structure in FIG. 3 can make the second active layer 106 completely fill the first via hole structure 116 to ensure that the second active layer 106 is not easily broken in the first via hole structure 116, and can also make the depth of the formed second via hole structure 113 shallow, thereby making it easier to form the second via hole structure 113.

For example, upon the source-drain electrode layer 110 being formed, a dry etching process is adopted, and a reducing gas is required when the dry etching process is performed. In the case that the material of the first active layer 104 and the material of the second active layer 106 are metal oxide semiconductor material, the reducing gas can be used first to reduce a part of the second active layer 106 away from the base substrate 101 to a simple metal, thereby reducing the resistivity of the second active layer 106. Further, the overall resistance of the first active layer 104 and the second active layer 106 is reduced after the first active layer 104 and the second active layer 106 are electrically connected, that is, it is unnecessary to add new equipment and material to reduce the resistance upon the first active layer 104 and the second active layer 106 being connected.

For example, in FIG. 3, an orthographic projection of a surface of the source-drain electrode layer 110 being in contact with the second active layer 106 on the base substrate 101 is at least partially overlapped with an orthographic projection of the first via hole structure 116 on the base substrate 101, which can make the electrode structure more compact and more conducive to improving the on-state current. If the source electrode 110*a* is offset to the left and the drain electrode 110*b* is offset to the right, it is difficult to show the characteristics of the thin film transistor 100. The structure in FIG. 3 can increase the contact area between the source-drain electrode layer 110 and the second active layer 106, so as to achieve the electric connection between the source-drain electrode layer 110 and the first active layer 104 and the second active layer 106.

For example, the material and the thickness of the source-drain electrode layer 110 can refer to the relevant descriptions of FIG. 2, and the repeated portions are omitted herein.

Figure 4:
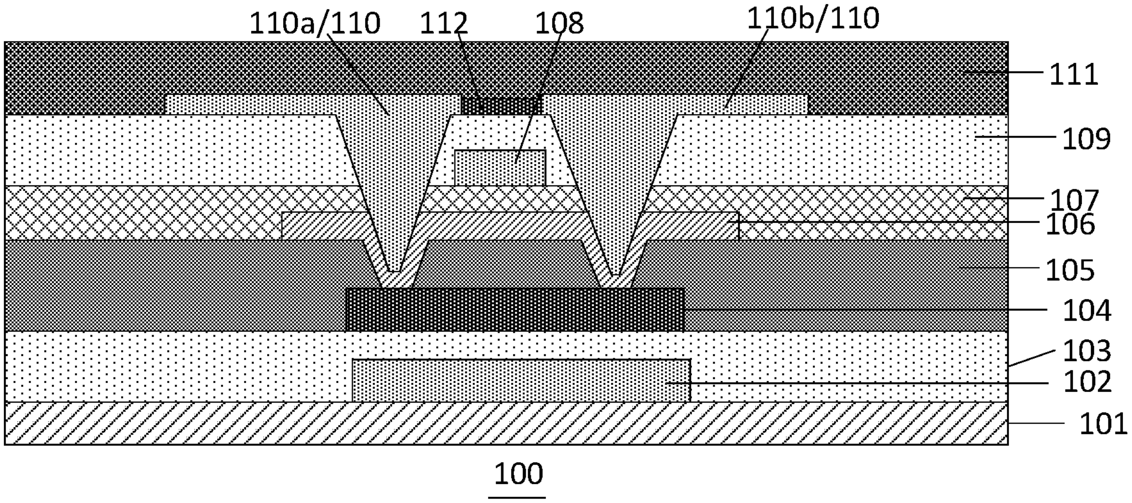
FIG. 4 is a schematic cross-sectional structure diagram of still another thin film transistor provided by an embodiment of the present disclosure.

For example, FIG. 4 is a schematic cross-sectional structure diagram of still another thin film transistor provided by an embodiment of the present disclosure. As illustrated by FIG. 4, the thin film transistor 100 further includes a third active layer 112, the third active layer 112 is arranged at a side of the second gate electrode 108 away from the base substrate 101, and the third active layer 112 is electrically connected with the source-drain electrode layer 110, and an interlayer insulating layer 109 is arranged between the third active layer 112 and the second gate electrode 108. For example, in FIG. 4, the source-drain electrode layer 110 is lapped at two sides of the third active layer 112, that is, the source electrode 110*a* is lapped on the left side of the third active layer 112, the drain electrode 110*b* is lapped on the right side of the third active layer 112, and the source-drain electrode layer 110 is electrically connected with the first active layer 104 and the second active layer 106 through the second via hole structure 113. The addition of the third active layer 112 further increases the on-state current of the thin film transistor. Compared with the structure in FIG. 1, the on-state current of the thin film transistor in FIG. 4 is three times that of the thin film transistor in FIG. 1.

Figure 5:
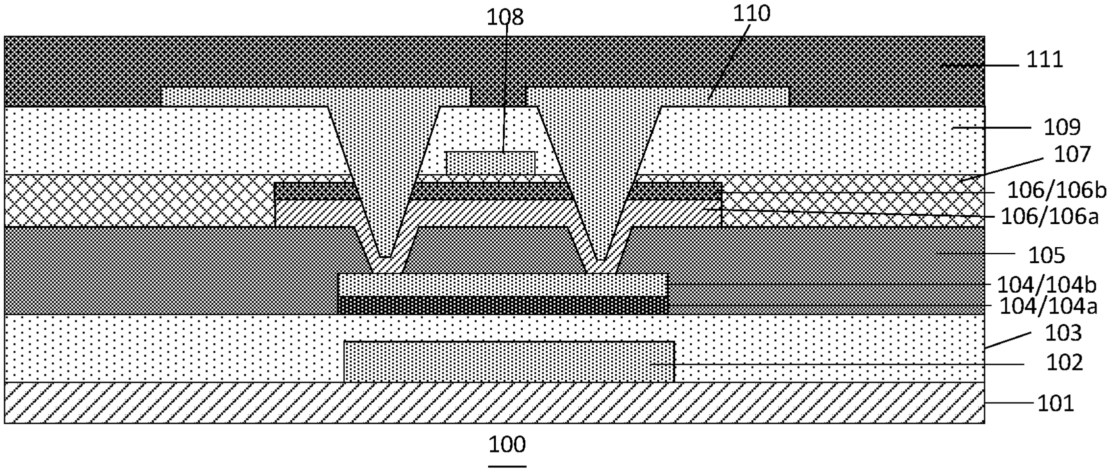
FIG. 5 is a schematic cross-sectional structure diagram of still another thin film transistor provided by an embodiment of the present disclosure.

For example, FIG. 5 is a schematic cross-sectional structure diagram of still another thin film transistor provided by an embodiment of the present disclosure, as illustrated by FIG. 5, the first active layer 104 includes a first sub-active layer 104*a* and a second sub-active layer 104*b* which are stacked, and the second active layer 106 includes a third sub-active layer 106*a* and a fourth sub-active layer 106*b* which are stacked. In an example, it is also possible that the first active layer 104 includes a first sub-active layer 104*a* and a second sub-active layer 104*b* which are stacked, and the second active layer 106 has a single-layer structure. In still another example, the second active layer 106 includes a third sub-active layer 106*a* and a fourth sub-active layer 106*b* which are stacked, and the first active layer 104 has a single-layer structure.

For example, the material of the first sub-active layer 104*a* and the material of the second sub-active layer 104*b* are the same or are different from each other, the material of the first sub-active layer 104*a* is one selected from the group consisting of zinc oxide (ZnO), indium oxide ($In_2O_3$), indium zinc oxide (IZO), aluminum-doped zinc oxide (AZO), boron-doped zinc oxide (BZO), magnesium-doped zinc oxide (MZO), zinc tin oxide (ZTO), indium gallium zinc oxide (IGZO) and indium tin zinc oxide (ITZO), gallium zinc oxide (GZO), indium tin oxide (ITO), hafnium zinc oxide (HIZO), tin oxide ($SnO_2$), tin protoxide (SnO) and cuprous oxide ($Cu_2O$), and the material of the second sub-active layer 104*b* is one of the above metal oxides or another one of the above materials which is different from the material of the first sub-active layer 104*a*.

For example, the first sub-active layer 104*a* is used to prevent the diffusion of elements, for example, prevent the elements in the first gate electrode 102 from spreading to the second sub-active layer 104*b*, carrier concentration of the second sub-active layer 104*b* is higher than that of the first sub-active layer 104*a*, band gap of the second sub-active layer 104*b* is smaller than that of the first sub-active layer 104*a*, and the second sub-active layer 104*b* is mainly used to transport carriers.

For example, the material of the third sub-active layer 106*a* and the material of the fourth sub-active layer 106*b* are the same or different from each other, the material of the third sub-active layer 106*a* is one selected from the group consisting of zinc oxide (ZnO), indium oxide ($In_2O_3$), indium zinc oxide (IZO), aluminum-doped zinc oxide (AZO), boron-doped zinc oxide (BZO), magnesium-doped zinc oxide (MZO), zinc tin oxide (ZTO), indium gallium zinc oxide (IGZO) and indium tin zinc oxide (ITZO), gallium zinc oxide (GZO), indium tin oxide (ITO), hafnium zinc oxide (HIZO), tin oxide ($SnO_2$), tin protoxide (SnO) and cuprous oxide ($Cu_2O$), and the material of the fourth sub-active layer 106*b* is one of the above metal oxides or another one of the above materials which is different from the material of the third sub-active layer 106*a*.

For example, the fourth sub-active layer 106*b* is used to prevent the diffusion of elements, for example, prevent the elements in the second gate electrode 108 from diffusing to the third sub-active layer 106*a*, carrier concentration of the third sub-active layer 106*a* is higher than that of the fourth sub-active layer 106*b*, band gap of the third sub-active layer 106*a* is smaller than that of the fourth sub-active layer 106*b*, and the third sub-active layer 106*a* is mainly used to transport carriers.

For example, according to FIG. 5, it should be noted that, in the structure shown in FIG. 4, the third active layer 112 may also include a fifth sub-active layer and a sixth sub-active layer which are stacked, and the material of the fifth sub-active layer and the material of the sixth sub-active layer are the same or different from each other, and the material of the fifth sub-active layer and the material of the sixth sub-active layer can be referred to the above-mentioned related descriptions about the first sub-active layer 104*a* and the second sub-active layer 104*b*, which are omitted herein.

It should be noted that, the material of the first sub-active layer 104*a*, the material of the second sub-active layer 104*b*, the material of the third sub-active layer 106*a*, the material of the fourth sub-active layer 106*b*, the material of the fifth sub-active layer and the material of the sixth sub-active layer can also be silicon-based material or organic semiconductor material, the silicon-based material and the organic semiconductor material can be referred to the above-mentioned related descriptions, and the repeated portions are omitted herein.

Figure 6:
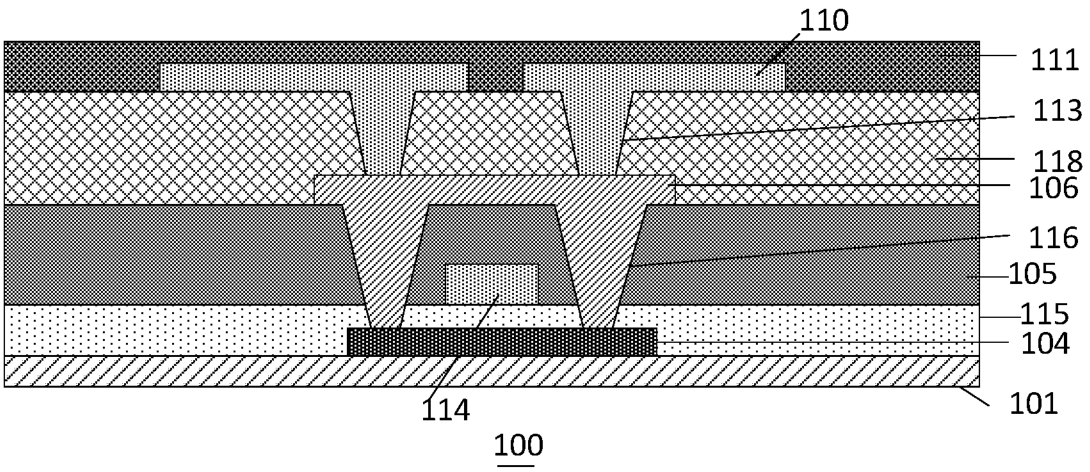
FIG. 6 is a schematic cross-sectional structure diagram of still another thin film transistor provided by an embodiment of the present disclosure.

For example, FIG. 6 is a schematic cross-sectional structure diagram of still another thin film transistor provided by an embodiment of the present disclosure. As illustrated by FIG. 6, the thin film transistor 100 includes a gate electrode 114, and the gate electrode 114 is between the first active layer 104 and the second active layer 106, that is, the gate electrode 114 is between the first active layer 104 and the second active layer 106, and the gate electrode 114 is configured to control both the first active layer 104 and the second active layer 106, so that the structure of the thin film transistor 100 is simple and the on-state current of the thin film transistor 100 can be doubled at the same time.

It should be noted that, the layer where the second active layer 106 is located does not include the part of the second active layer 106 which is located in the second via hole structure.

For example, as illustrated by FIG. 6, a gate insulating layer 115 is arranged at a side of the gate electrode 114 away from the first insulating layer 105, the first via hole structure 116 penetrates through both the first insulating layer 105 and the gate insulating layer 115, and the second active layer 106 is electrically connected with the first active layer 104 through the first via hole structure 116.

For example, as illustrated by FIG. 6, a second insulating layer 118 is arranged between the second active layer 106 and the source-drain electrode layer 110, and the second via hole structure 113 penetrates through the second insulating layer 118, the source-drain electrode layer 110 is electrically connected with the second active layer 106 through the second via hole structure 113. In FIG. 6, the second active layer 106 completely fills the first via hole structure 116, and the source-drain electrode layer 110 does not extend into the first via hole structure 116. However, the embodiments of the present disclosure are not limited thereto, and the source-drain electrode layer 110 can refer to the structure in FIG. 2 and extends into the first via hole structure 116.

Figure 7:
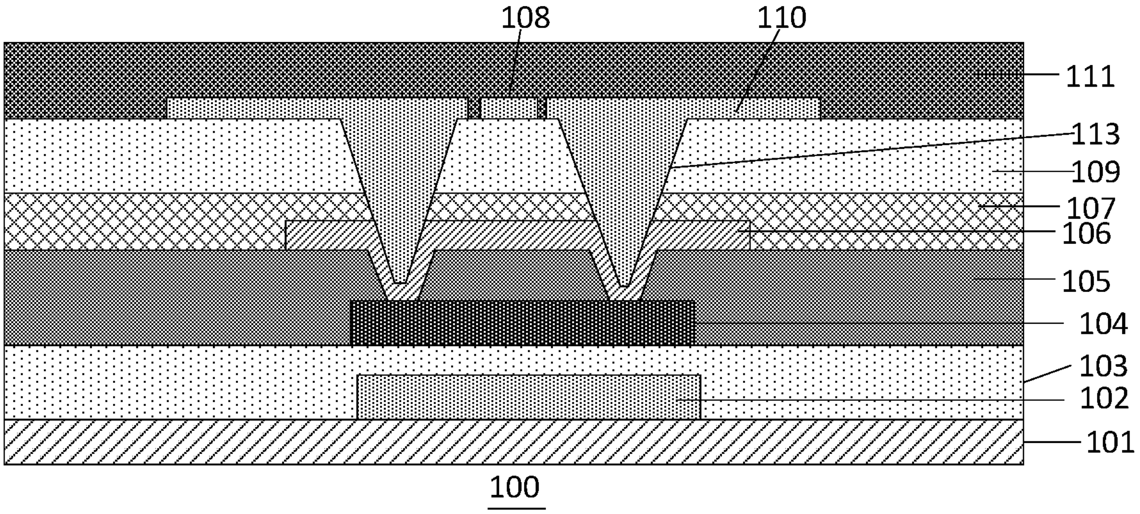
FIG. 7 is a schematic cross-sectional structure diagram of still another thin film transistor provided by an embodiment of the present disclosure.

For example, FIG. 7 is a schematic diagram of a cross-sectional structure of still another thin film transistor provided by an embodiment of the present disclosure. As illustrated by FIG. 7, the source-drain electrode layer 110 and the second gate electrode 108 are arranged on the same layer, and an interlayer insulating layer 109 is arranged at a side of the second gate electrode 108 close to the base substrate 101. The second via hole structure 113 sequentially penetrates through the interlayer insulating layer 109, the second gate insulating layer 107 and a part of the first insulating layer 105.

For example, as illustrated by FIG. 7, a passivation layer 111 is arranged at a side of the source-drain electrode layer 100 and the interlayer insulating layer 109 away from the base substrate 101, and the passivation layer 111 can prevent foreign impurities or water vapor from entering the thin film transistor 100, thereby affecting the performance of the thin film transistor.

Figure 8:
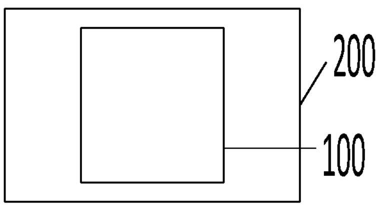
FIG. 8 is a block diagram of an array substrate provided by an embodiment of the present disclosure.

At least one embodiment of the present disclosure further provides an array substrate, and the array substrate includes any one of the thin film transistors in the above embodiments. For example, FIG. 8 is a block diagram of an array substrate provided by an embodiment of the present disclosure, and the array substrate 200 includes the thin film transistor 100. The array substrate can be used in a display device, and the display device can be any product or component with a display function such as a liquid crystal panel, an electronic paper, an OLED panel, a mobile phone, a tablet computer, a television, a display, a notebook computer, a digital photo frame, a navigator, and so on.

At least one embodiment of the present disclosure further provides a manufacturing method of a thin film transistor, which includes: providing a base substrate; sequentially forming a first active layer, a first insulating layer and a second active layer on the base substrate, in which the first active layer is in contact with the second active layer through a first via hole structure in the first insulating layer, and non-contacted portions of the first active layer and the second active layer are separated by the first insulating layer.

Figure 9:
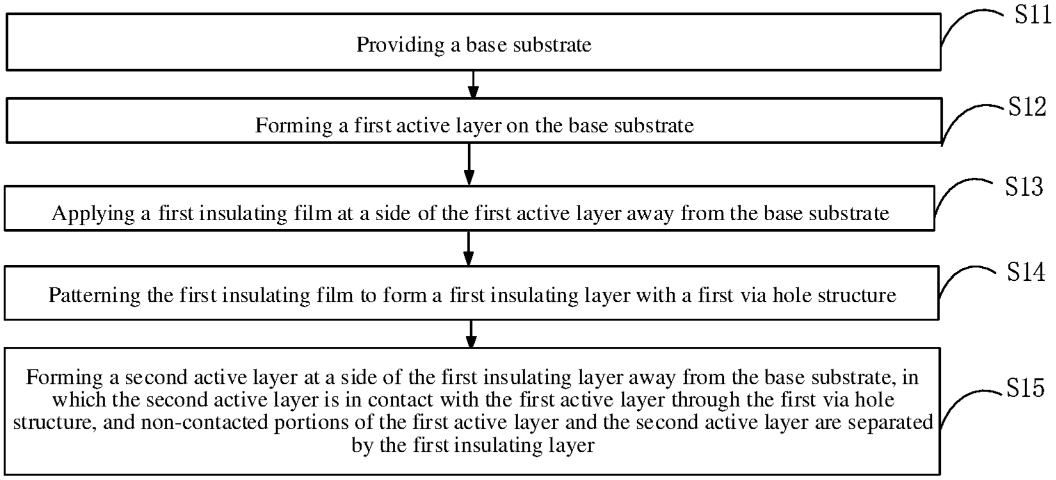
FIG. 9 is a flowchart of a manufacturing method of a thin film transistor provided by an embodiment of the present disclosure.

For example, FIG. 9 is a flowchart of a manufacturing method of a thin film transistor provided by an embodiment of the present disclosure, and as illustrated by FIG. 9, the manufacturing method includes the following steps.

S11: providing a base substrate.

S12: forming a first active layer on the base substrate.

S13: applying a first insulating film at a side of the first active layer away from the base substrate.

S14: patterning the first insulating film to form a first insulating layer with a first via hole structure.

S15: forming a second active layer at a side of the first insulating layer away from the base substrate, in which the second active layer is in contact with the first active layer through the first via hole structure, and non-contacted portions of the first active layer and the second active layer are separated by the first insulating layer.

For example, FIGS. 10A-10E are process diagrams of a manufacturing method of a thin film transistor provided by an embodiment of the present disclosure.

Figure 10A:
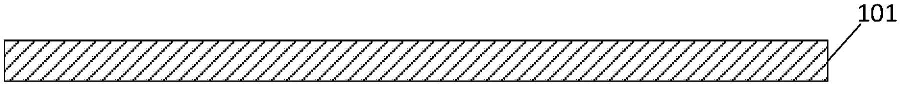
FIGS. 10A-10E are process diagrams of a manufacturing method of a thin film transistor provided by an embodiment of the present disclosure.

As illustrated by FIG. 10A, a base substrate 101 is provided, and the base substrate 101 is made of a rigid material or a flexible material. For example, the rigid material includes one of rigid glass and silicon wafer; the flexible material includes one of polyethylene naphthalate, polyethylene terephthalate, polyimide and flexible glass.

Figure 10B:
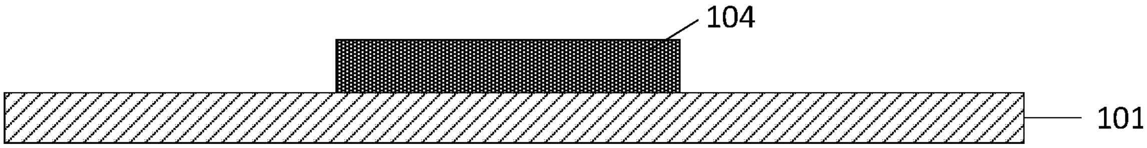

As illustrated by FIG. 10B, the first active layer 104 is formed on the base substrate 101. For example, the material of the first active layer 104 may be a silicon-based material, a metal oxide semiconductor material or an organic semiconductor material.

For example, in the case that the material of the first active layer 104 is a metal oxide semiconductor material, the metal oxide semiconductor material includes an n-type semiconductor material, such as: zinc oxide (ZnO), indium oxide ($In_2O_3$), indium zinc oxide (IZO), aluminum doped zinc oxide (AZO), boron doped zinc oxide (BZO), magnesium doped zinc oxide (MZO), zinc tin oxide (ZTO), indium gallium zinc oxide (IGZO), indium tin zinc oxide (ITZO), gallium zinc oxide (GZO), indium tin oxide (ITO), hafnium indium zinc oxide (HIZO) and tin oxide ($SnO_2$) and a p-type semiconductor material, such as tin protoxide (SnO) and cuprous oxide ($Cu_2O$). For example, the first active layer 104 made of metal oxide semiconductor material can be formed by magnetron sputtering, reactive sputtering, anodic oxidation or spin coating.

For example, the material of the first active layer 104 may be silicon, germanium, silicon-germanium mixed material, etc. The first active layer 104 made of the above semiconductor material can be formed by magnetron sputtering or spin coating.

For example, the material of the first active layer 104 can also be an organic semiconductor material, and the organic semiconductor material includes pentacene, triphenylamine, fullerene, phthalein, polythiophene, polyaniline, polypyrrole, etc. The above organic semiconductor material can be formed by spin coating.

For example, a thickness of the first active layer 104 is in the range from 5 nm to 200 nm, for example, the thickness of the first active layer 104 is 50 nm, 100 nm, 150 nm or 200 nm.

Figure 10C:
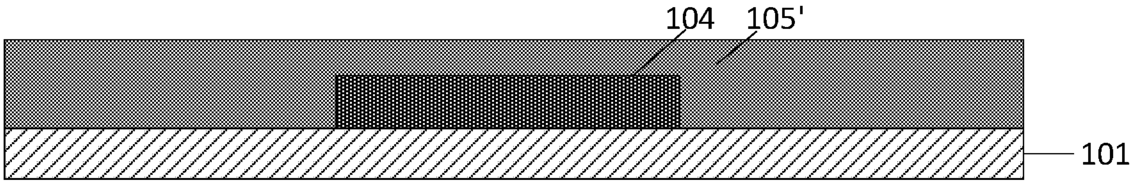

As illustrated by FIG. 10C, a first insulating film 105' is applied at a side of the first active layer 104 away from the base substrate 101.

Figure 10D:
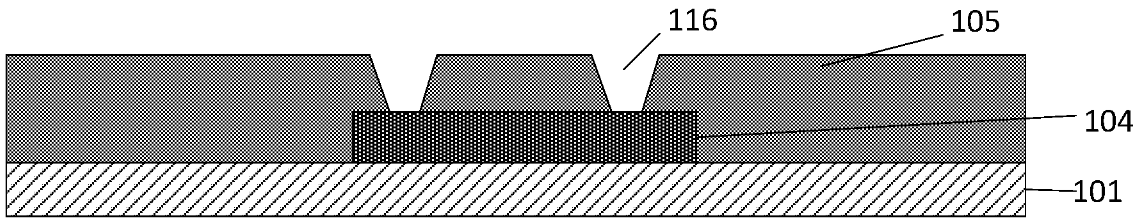

As illustrated by FIG. 10D, the first insulating film 105' is patterned to form the first insulating layer 105 with the first via hole structure 116.

For example, patterning the first insulating film 105' includes: coating photoresist on the first insulating film 105', and processing the first insulating film 105' by exposure, development, etching and photoresist stripping to form the first insulating layer 105 with the first via hole structure 116.

For example, the material of the first insulating layer 105 includes one or more selected from the group consisting of silicon oxide, silicon nitride, aluminum oxide, hafnium oxide, tantalum oxide and zirconium oxide.

For example, the thickness of the first insulating layer 105 is in the range from 5 nm to 400 nm, such as 50 nm, 100 nm, 200 nm, 300 nm or 400 nm.

Figure 10E:
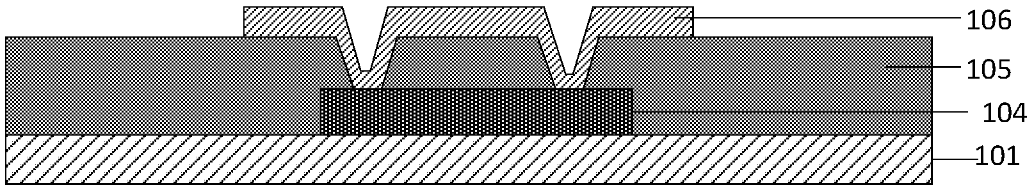

As illustrated by FIG. 10E, the second active layer 106 is formed at a side of the first insulating layer 105 away from the base substrate 101. The selection range of the material of the second active layer 106 is the same as that of the first active layer 104, and the thickness of the second active layer 106 is in the range from 5 nm to 200 nm, for example, the thickness of the second active layer 106 is 50 nm, 100 nm, 150 nm or 200 nm.

As illustrated by FIG. 10E, the second active layer 106 is in contact with the first active layer 104 through the first via hole structure 116 in the first insulating layer 105, and the non-contacted portions of the first active layer 104 and the second active layer 106 are separated by the first insulating layer 105.

For example, the first active layer 104 is in contact with the second active layer 106 through the first via hole structure 116 located in the first insulating layer 105, so as to achieve the electric connection.

For example, the number of the first via hole structures 116 may be one or more. In the cross-sectional structure of the thin film transistor shown in FIG. 10D, the number of the first via hole structures 116 is two, the two first via hole structures 116 are spaced apart from each other, and a sum of widths of edges of the two first via hole structures 116 close to the base substrate 101 is smaller than a maximum width of the first active layer 104 in the horizontal direction and a maximum width of the second active layer 106 in the horizontal direction.

For example, a side of each of the first via hole structures 116 close to the base substrate 101 and a sidewall defining the first via hole structure 116 are covered with the second active layer 106, and each of the first via hole structures 116 is not completely filled with the second active layer 106.

For example, as illustrated by FIG. 10E, an orthographic projection of each of the first via hole structures 116 on the base substrate 101 is smaller than an orthographic projection of the first active layer 104 on the base substrate 101 and an orthographic projection of the second active layer 106 on the base substrate 101. A sum of orthographic projections of a plurality of first via hole structures 116 on the base substrate 101 is smaller than the orthographic projection of the first active layer 104 on the base substrate 101 and the orthographic projection of the second active layer 106 on the base substrate 101. Of course, the embodiment of the present disclosure is not limited thereto, and the orthographic projection of each of the first via hole structures 116 on the base substrate 101 may be greater than or equal to the orthographic projection of the first active layer 104 on the base substrate 101.

For example, the material of the first active layer 104 and the material of the second active layer 106 may be the same or different from each other. Both the material of the first active layer 104 and the material of the second active layer 106 may be silicon-based material, metal oxide semiconductor material, or organic semiconductor material. The material of the first active layer 104 is one of the silicon-based material, the metal oxide semiconductor material and the organic semiconductor material, and the material of the second active layer 106 is one of the other two materials different from the material of the first active layer 104.

Figure 11:
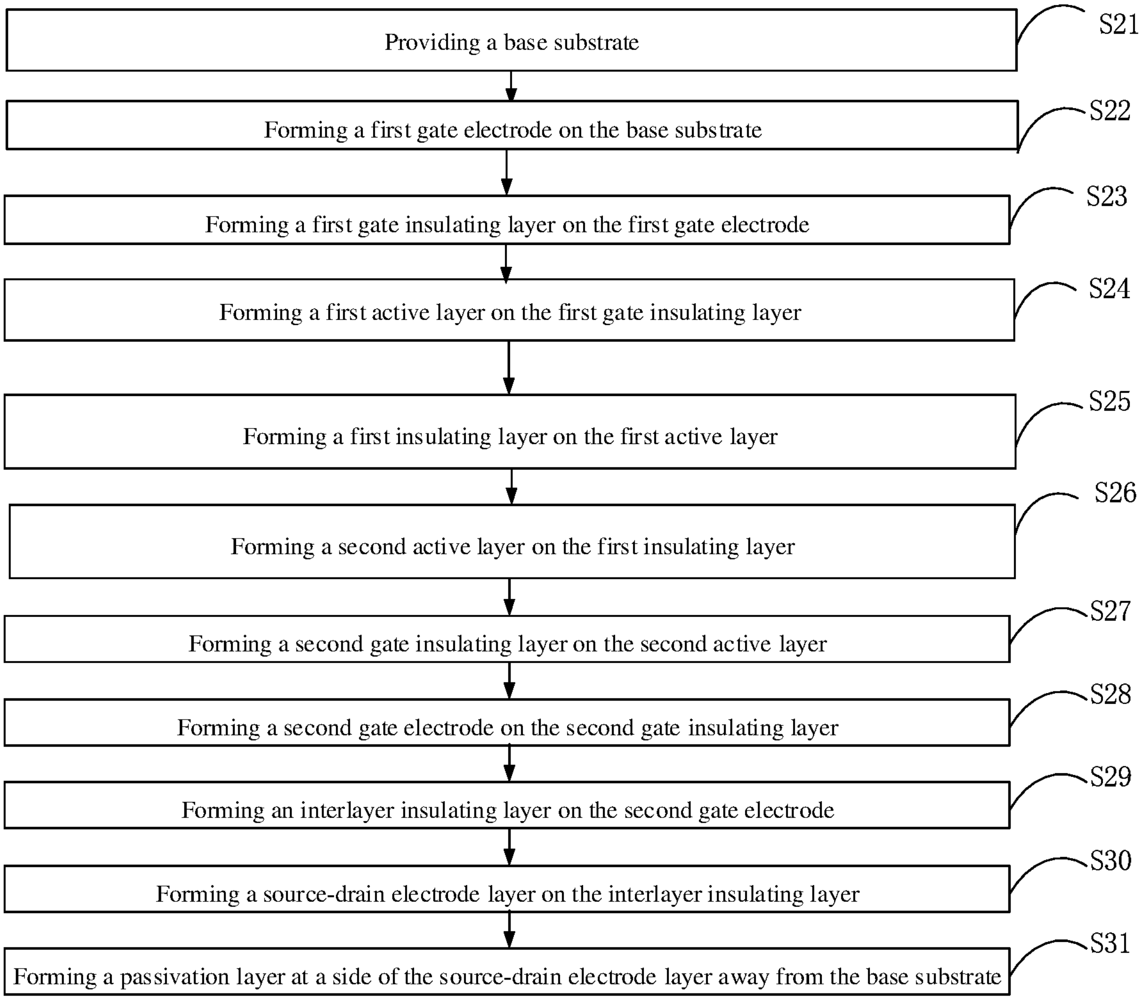
FIG. 11 is a flowchart of a manufacturing method of a thin film transistor provided by an embodiment of the present disclosure.

For example, FIG. 11 is a flowchart of a manufacturing method of a thin film transistor provided by an embodiment of the present disclosure, and as illustrated by FIG. 11, the manufacturing method includes:

S21: providing a base substrate.

S22: forming a first gate electrode on the base substrate.

For example, a first gate electrode film is applied on the base substrate, photoresist is coated on the first gate electrode film, and the first gate electrode film is patterned by exposure, development, etching, photoresist stripping and other processes to form the first gate electrode.

For example, the photoresist can be coated by spin coating, blade coating or roller coating.

For example, the material of the first gate electrode includes one metal or a combination of more metals selected from the group consisting of molybdenum (Mo), chromium (Cr), titanium (Ti), aluminum (Al), aluminum alloy and copper (Cu). The material of the first gate electrode may also include one or a combination of more transparent conductive materials selected from the group consisting of indium tin oxide (ITO), aluminum-doped zinc oxide (AZO) and boron-doped zinc oxide (BZO). The first gate electrode may have a single-layer structure or a double-layer structure. The first gate electrode of the double-layer structure can be a composite conductive layer composed of metal and transparent conductive material.

For example, in one example, the material of the first gate electrode can be a combination of copper and other metals, such as copper/molybdenum (Cu/Mo), copper/titanium (Cu/Ti), copper/molybdenum titanium alloy (Cu/MoTi), copper/molybdenum tungsten alloy (Cu/MoW), copper/molybdenum niobium alloy (Cu/MoNb); the material of the first gate electrode can also be a chromium-based metal or a combination of chromium and other metals, such as chromium/molybdenum (Cr/Mo), chromium/titanium (Cr/Ti), chromium/molybdenum titanium alloy (Cr/MoTi), and so on.

For example, the thickness of the first gate electrode may be in the range from 50 nm to 300 nm, and the thickness of the first gate electrode 102 may be in 50 nm, 100 nm, 200 nm or 300 nm.

For example, the first gate electrode film can be formed by magnetron sputtering, electron beam evaporation or thermal evaporation, or by magnetron sputtering or optical coating.

S23: forming a first gate insulating layer on the first gate electrode.

For example, a first gate insulating film is deposited on the first gate electrode, and the first gate insulating film is patterned to form the first gate insulating layer.

For example, the first gate insulating layer can be formed by at least one of insulating materials such as silicon oxide ($SiO_x$), silicon nitride ($SiN_x$), aluminum oxide ($Al_2O_3$), aluminum nitride (AlN) and the like, and the first gate insulating layer can be formed by the method of plasma enhanced chemical vapor deposition (PECVD), or an organic insulating material can be formed by spin coating to form the first gate insulating layer.

S24: forming a first active layer on the first gate insulating layer.

For example, the first active layer film is applied on the first gate insulating layer by magnetron sputtering, and photoresist is formed on the first active layer film. The first active layer film is patterned by exposure, development, etching and photoresist stripping processes to form the first active layer.

For example, the material of the first active layer can be referred to the above-mentioned related descriptions of the embodiment of the thin film transistor, which are omitted herein.

S25: forming a first insulating layer on the first active layer.

For example, a first insulating layer film is applied at the side of the first active layer away from the base substrate, and the first insulating layer film is patterned to form a first insulating layer with a first via hole structure.

For example, patterning the first insulating layer film includes: coating photoresist on the first insulating layer film, and processing the first insulating layer film by exposure, development, etching and photoresist stripping to form the first insulating layer with the first via hole structure.

S26: forming a second active layer on the first insulating layer.

For example, the second active layer film is applied on the first insulating layer by magnetron sputtering, photoresist is formed on the second active layer film, and the second active layer film is patterned by exposure, development, etching and photoresist stripping to form the second active layer.

For example, the second active layer fills a part of the first via hole structure, that is, the second active layer does not completely fill the first via hole structure.

For example, the material of the second active layer can be referred to the above-mentioned related descriptions of the embodiments of the thin film transistors, which are omitted herein.

S27: forming a second gate insulating layer on the second active layer.

For example, a second gate insulating film is applied at a side of the second active layer away from the base substrate, and the second gate insulating film is patterned to form the second gate insulating layer.

For example, the second gate insulating layer can be formed by at least one of insulating materials such as silicon oxide ($SiO_x$), silicon nitride ($SiN_x$), aluminum oxide ($Al_2O_3$), aluminum nitride (AlN), etc., and the second gate insulating layer can be formed by the method of plasma enhanced chemical vapor deposition (PECVD), or the second gate insulating layer can be formed by organic insulating materials by spin coating method to form the second gate insulating layer.

S28: forming a second gate electrode on the second gate insulating layer.

For example, a second gate electrode film is applied at a side of the second gate insulating layer away from the base substrate, photoresist is formed on the second gate electrode film, and the second gate electrode film is patterned by exposure, development, etching and photoresist stripping processes to form a second gate electrode.

For example, the photoresist can be coated by spin coating, blade coating or roller coating.

For example, the material of the second gate electrode includes one metal or a combination of more metals selected from the group consisting of molybdenum (Mo), chromium (Cr), titanium (Ti), aluminum (Al), aluminum alloy and copper (Cu). The material of the second gate electrode may also include one or a combination of more transparent conductive materials selected from the group consisting of indium tin oxide (ITO), aluminum-doped zinc oxide (AZO) and boron-doped zinc oxide (BZO). The second gate electrode can have a single-layer structure or a double-layer structure. The second gate electrode of the double-layer structure can be a composite conductive layer composed of metal and transparent conductive material.

For example, in an example, the material of the second gate electrode can be a combination of copper and other metals, such as copper/molybdenum (Cu/Mo), copper/titanium (Cu/Ti), copper/molybdenum titanium alloy (Cu/MoTi), copper/molybdenum tungsten alloy (Cu/MoW), copper/molybdenum niobium alloy (Cu/MoNb); the material of the second gate electrode can also be a chromium-based metal or a combination of chromium and other metals, such as chromium/molybdenum (Cr/Mo), chromium/titanium (Cr/Ti), chromium/molybdenum titanium alloy (Cr/MoTi), etc.

For example, the thickness of the second gate electrode may be in the range from 50 nm to 300 nm, and the thickness of the second gate electrode may be 50 nm, 100 nm, 200 nm or 300 nm.

For example, the second gate electrode film can be formed by magnetron sputtering, electron beam evaporation or thermal evaporation, or by magnetron sputtering or optical coating.

S29: forming an interlayer insulating layer on the second gate electrode.

For example, an interlayer insulating film is applied at a side of the second gate electrode away from the base substrate, photoresist is coated on the interlayer insulating film, and the interlayer insulating film and the second gate insulating layer are patterned by processes such as exposure, development, etching and photoresist stripping, so as to form the interlayer insulating layer and the second via hole structure penetrating through the interlayer insulating layer, the second gate insulating layer and a part of the first insulating layer.

For example, the material of the interlayer insulating layer includes at least one of insulating materials such as silicon oxide ($SiO_x$), silicon nitride ($SiN_x$), aluminum oxide ($Al_2O_3$), aluminum nitride (AlN), etc., and the interlayer insulating layer is formed by the method of plasma enhanced chemical vapor deposition (PECVD), or an organic insulating material can be formed by spin coating to form the interlayer insulating layer.

S30: forming a source-drain electrode layer on the interlayer insulating layer.

For example, a source-drain electrode film is applied at a side of the interlayer insulating layer away from the base substrate by the magnetron sputtering method, and photoresist is formed on the source-drain electrode film. The source-drain electrode film is patterned by exposure, development, etching, photoresist stripping and other processes to form the source-drain electrode layer. The material and the thickness of the source-drain electrode layer can be referred to the above descriptions, which are omitted herein.

For example, in the case that the first active layer and the second active layer are connected, the resistance is high, and a dry etching process will be adopted upon the source-drain electrode layer being formed, and a reducing gas is required when the dry etching process is performed. In the case that the first active layer and the second active layer are made of metal oxide semiconductor material, the reducing gas can be used first to reduce a part of the second active layer exposed to the second via hole structure to a simple metal, thus reducing the resistivity of the second active layer, and then the overall resistance of the first active layer and the second active layer is reduced after they are electrically connected, that is, the resistance of the first active layer and the second active layer when they are connected can be reduced without adding new equipment and materials.

S31: forming a passivation layer at a side of the source-drain electrode layer away from the base substrate.

For example, the passivation layer can be formed by the method of plasma chemical vapor deposition. The passivation layer is made of silicon nitride ($SiN_x$), silicon oxide ($SiO_x$), acrylic resin, etc., and the passivation layer can prevent external impurities or water vapor from entering the thin film transistor, thereby affecting the performance of the thin film transistor.

For example, it is also possible to deposit a passivation layer film at a side of the source-drain electrode layer away from the base substrate, photoresist is coated on the passivation layer film, and the passivation layer film is processed by exposure, development, etching and photoresist stripping to form the passivation layer.

For example, FIGS. 12A-12K are process diagrams of a manufacturing method of a thin film transistor provided by an embodiment of the present disclosure, and the manufacturing method includes the following steps.

Figure 12A:
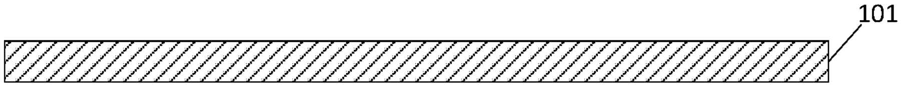
FIGS. 12A-12K are process diagrams of a manufacturing method of a thin film transistor provided by an embodiment of the present disclosure.

As illustrated by FIG. 12A, a base substrate 101 is provided, and the material of the base substrate 101 can be referred to the related descriptions mentioned above, which are omitted herein.

Figure 12B:
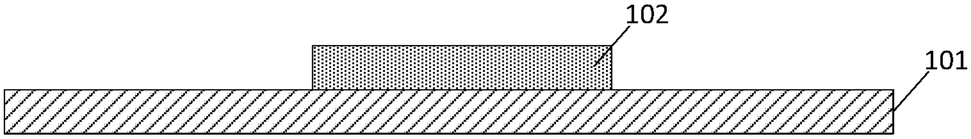

As illustrated by FIG. 12B, a first gate electrode 102 is formed on the base substrate 101. The specific process of forming the first gate electrode 102 is to form a first gate electrode material layer on the base substrate 101 and pattern the first gate electrode material layer to form the first gate electrode 102.

For example, the material and the forming method of the first gate electrode 102 can be referred to the above descriptions, which are omitted herein.

Figure 12C:
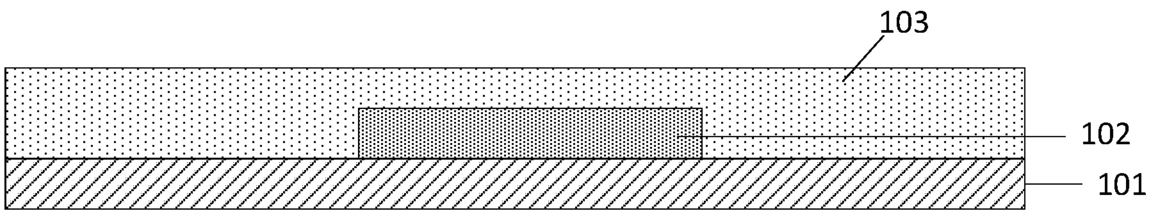

As illustrated by FIG. 12C, a first gate insulating layer 103 is formed on the first gate electrode 102. The material and the thickness of the first gate insulating layer 103 can be referred to the above descriptions, which are omitted herein.

For example, silicon oxide ($SiO_2$) or silicon nitride ($SiN_x$) can be deposited by the method of plasma enhanced chemical vapor deposition (PECVD) to form the first gate insulating layer 103, or the first gate insulating layer 103 can be formed by spin coating the organic insulating material.

Figure 12D:
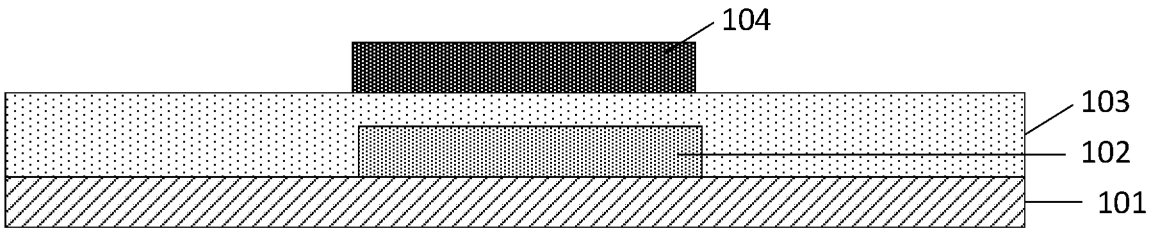

As illustrated by FIG. 12D, a first active layer 104 is formed on the first gate insulating layer 103.

For example, the first active layer material is deposited on the first gate insulating layer 103, and the first active layer material is patterned to form the first active layer 104. The material, the forming method and the thickness of the first active layer 104 can be referred to the above descriptions, which are omitted herein.

Figure 12E:
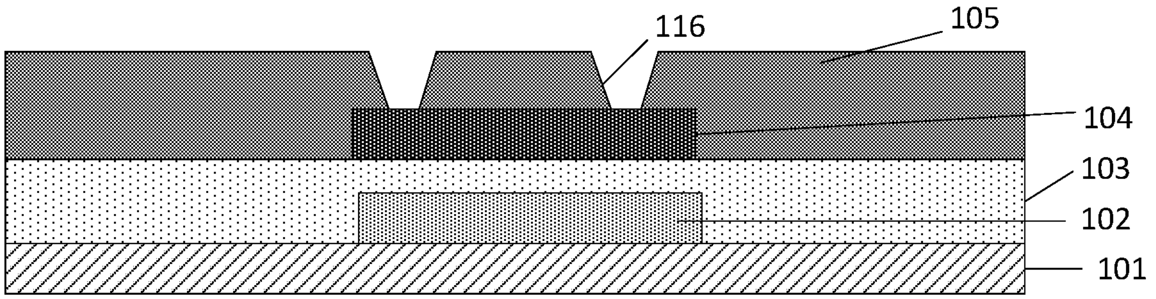

As illustrated by FIG. 12E, a first insulating layer 105 is formed on the first active layer 104, and a first via hole structure 116 is formed in the first insulating layer 105. The material of the first insulating layer 105 and the forming method of the first via hole structure 116 can be referred to the above-mentioned related descriptions, which are omitted herein.

Figure 12F:
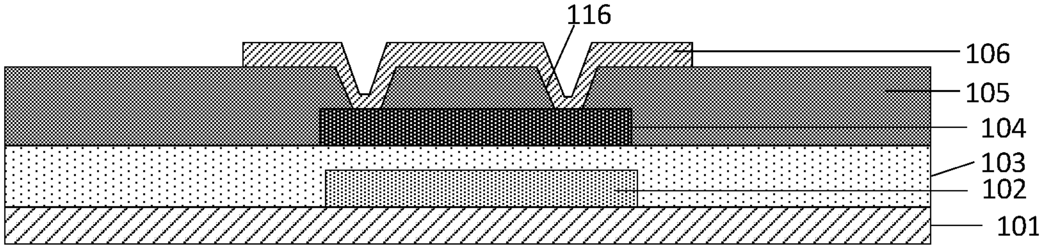

As illustrated by FIG. 12F, a second active layer 106 is formed on the first insulating layer 105. The first active layer 104 is in contact with the second active layer 106 through the first via hole structure 116 in the first insulating layer 105, and the non-contacted portions of the first active layer 104 and the second active layer 106 are separated by the first insulating layer 105.

For example, the second active layer material is deposited on the patterned first insulating layer 105, and the second active layer material is patterned to form the second active layer 106. For example, the number of the first via hole structures 116 is multiple, for example, two. The bottom and the sidewall of each of the first via hole structures 116 in the first insulating layer 105 are covered with the second active layer 106, and each of the first via hole structures 116 is not completely filled with the second active layer 106.

For example, the material and the structure of the second active layer 106 can be referred to the above descriptions, which are omitted herein.

Figure 12G:
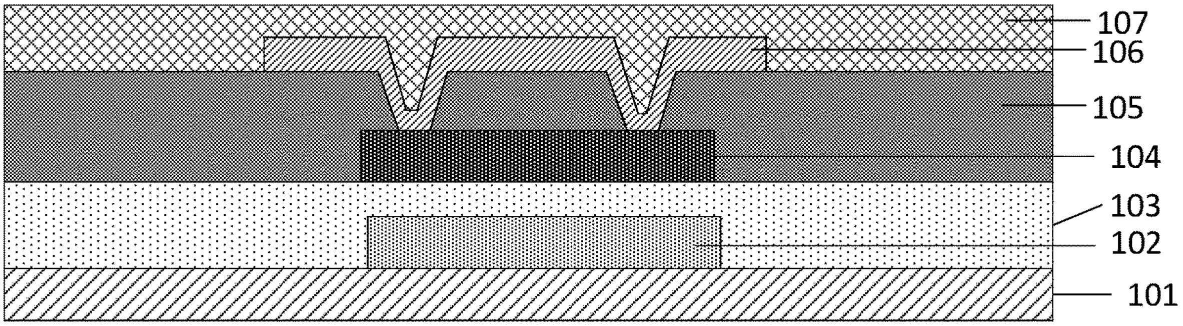

As illustrated by FIG. 12G, a second gate insulating layer 107 is formed on the second active layer 106.

For example, the forming method and the material of the second gate insulating layer 107 can be referred to the above-mentioned description of the first gate insulating layer 103, which are omitted herein.

Figure 12H:
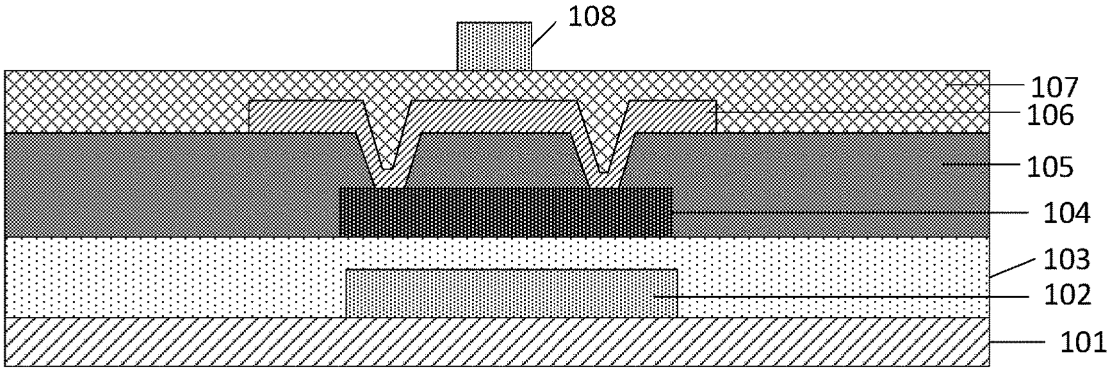

As illustrated by FIG. 12H, a second gate electrode 108 is formed on the second gate insulating layer 107.

For example, the material and the forming method of the second gate electrode 108 can be referred to the above descriptions, which are omitted herein.

Figure 12I:
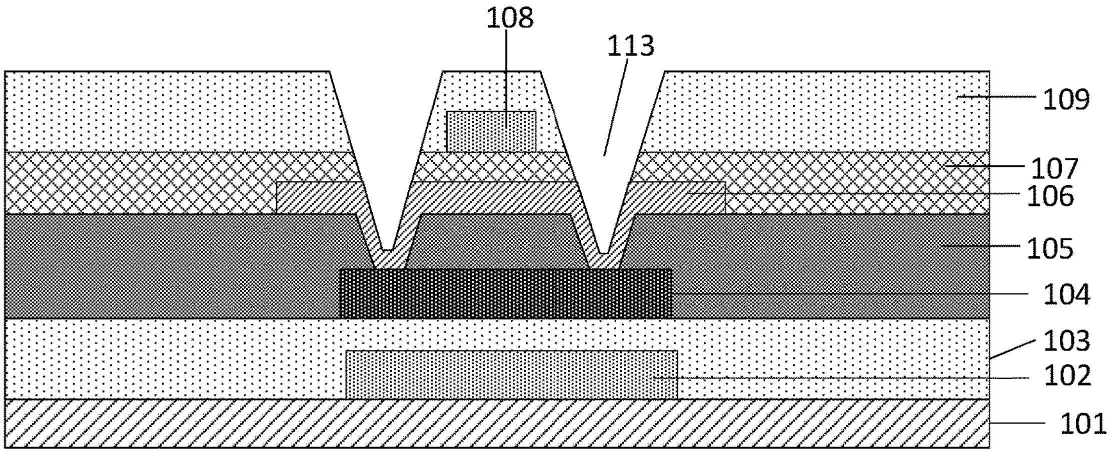

As illustrated by FIG. 12I, an interlayer insulating layer 109 is formed on the second gate electrode 108.

For example, second via hole structures 113 are formed in the interlayer insulating layer 109 and the second gate insulating layer 107, and the material of the interlayer insulating layer 109 can be referred to the above descriptions, which are omitted herein.

Figure 12J:
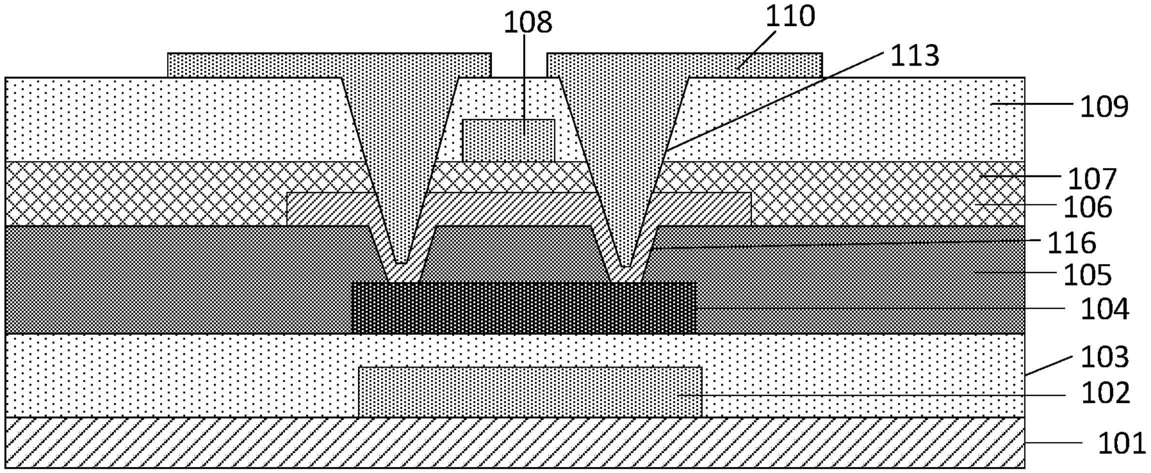

As illustrated by FIG. 12J, a source-drain electrode layer 110 is formed on the interlayer insulating layer 109.

For example, a conductive material is deposited on the interlayer insulating layer 109 and in the second via hole structure 113, and the conductive material is patterned to form the source-drain electrode layer 110 (including a source electrode 110*a* and a drain electrode 110*b*), the source electrode 110*a* and the drain electrode 110*b* are electrically connected to both the first active layer 104 and the second active layer 106.

For example, the source-drain electrode layer 110 is electrically connected with the second active layer 106 through the second via hole structure 113. In one example, an orthographic projection of the first via hole structure 116 on the base substrate 101 is at least partially overlapped with an orthographic projection of the second via hole structure 113 on the base substrate 101, and at least a part of the source-drain electrode layer 110 extends into the first via hole structure 116.

For example, in one example, a part of the second via hole structure 113 is formed in the first via hole structure 116, and the orthographic projection of the second via hole structure 113 on the base substrate 101 is located in the orthographic projection of the first via hole structure 116 on the base substrate 101.

For example, the material of the source-drain electrode layer 110 may include one metal or a combination of more metals selected from the group consisting of molybdenum (Mo), chromium (Cr), titanium (Ti), aluminum (Al), aluminum alloy and copper (Cu).

For example, the material of the source-drain electrode layer 110 is copper-based metal. Copper has the characteristics of low resistivity and good conductivity, so it can improve the signal transmission rate of the source electrode and the drain electrode and improve the display quality.

For example, the copper-based metal is copper (Cu), or a copper base metal alloy with stable properties, such as copper-zinc alloy (CuZn), copper-nickel alloy (CuNi) or copper-zinc-nickel alloy (CuZnNi).

For example, the thickness of the source-drain electrode layer 110 may be in the range from 200 nm to 400 nm, for example, 200 nm, 230 nm, 250 nm, 300 nm, 350 nm, 380 nm and 400 nm.

For example, the source-drain electrode layer material is deposited on the interlayer insulating layer 109, photoresist is coated on the source-drain electrode layer material, and the source-drain electrode layer material is patterned by processes such as exposure, development, etching and photoresist stripping, and so on to form the source-drain electrode layer. For example, the source-drain electrode layer can also be formed by the method of dry etching with reducing gas.

Figure 12K:
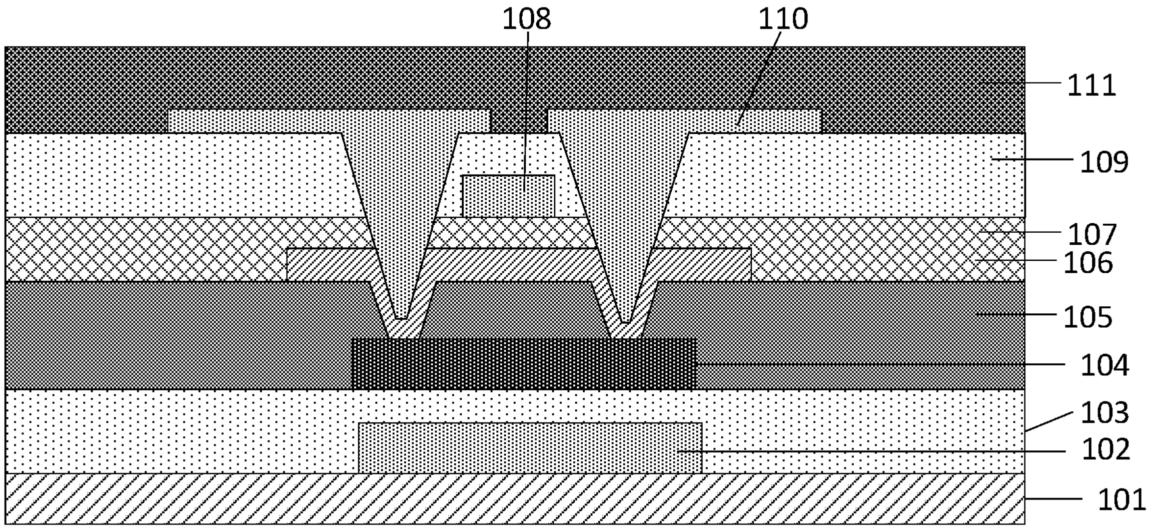

As illustrated by FIG. 12K, a passivation layer 111 is formed at a side of the source-drain electrode layer away from the base substrate 101.

For example, the passivation layer 111 can be formed by a plasma chemical vapor deposition method.

For example, compared with the process diagram of forming the thin film transistor in FIG. 2, upon the structure of the thin film transistor shown in FIG. 3 being formed, each of the first via hole structures 116 is filled with the second active layer 106, so that the second active layer 106 completely fills the first via hole structure 116 to ensure that the second active layer 106 is not easily broken in the first via hole structure 116, and the depth of the formed second via structure 113 can also be reduced, so that the second via hole structure 113 is more easy to be formed. The formed second via hole structure 113 penetrates through the interlayer insulating layer 109 and a part of the second gate insulating layer 107, and the source-drain electrode layer 110 is in direct contact with the surface of the second active layer 106 away from the base substrate 101 through the second via hole structure 113.

For example, compared with the process diagram of forming the thin film transistor in FIG. 2, upon the structure of the thin film transistor shown in FIG. 4 being formed, the manufacturing method further includes: after forming the interlayer insulating layer 109, before or after forming the source-drain electrode layer 110, forming the third active layer 112 at a side of the interlayer insulating layer 109 away from the base substrate 101, the third active layer 112 is electrically connected with the source-drain electrode layer 110, and the interlayer insulating layer 109 is arranged between the third active layer 112 and the second gate electrode 108. For example, referring to FIG. 4, the source-drain electrode layer 110 is lapped on two sides of the third active layer 112, that is, the source electrode 110*a* is lapped on the left side of the third active layer 112, the drain electrode 110*b* is lapped on the right side of the third active layer 112, and the source-drain electrode layer 110 is electrically connected with the first active layer 104 and the second active layer 106 through the second via hole structure 113. The addition of the third active layer 112 further increases the on-state current of the thin film transistor. Compared with the structure in FIG. 1, the on-state current of the thin film transistor in FIG. 4 is three times that of the thin film transistor in FIG. 1.

For example, compared with the process diagram of forming the thin film transistor in FIG. 2, upon the structure of the thin film transistor shown in FIG. 5 being formed, the first active layer 104 formed in the manufacturing method includes a first sub-active layer 104*a* and a second sub-active layer 104*b* which are stacked, and the second active layer 106 includes a third sub-active layer 106*a* and a fourth sub-active layer 106*b* which are stacked. The materials and the manufacturing methods of the first sub-active layer 104*a*, the second sub-active layer 104*b*, the third sub-active layer 106*a*, and the fourth sub-active layer 106*b* can be referred to the above descriptions, which are omitted herein.

For example, compared with the process diagram of forming the thin film transistor in FIG. 2, upon the structure of the thin film transistor shown in FIG. 6 being formed, in the manufacturing method, only one gate electrode 114 is formed between the layer where the first active layer 104 is located and the layer where the second active layer 106 is located, and the gate electrode 114 is configured to control both the first active layer 104 and the second active layer 106, so that the structure of the thin film transistor 100 is simplified and the on-state current of thin film transistor 100 can be doubled at the same time.

For example, upon the thin film transistor shown in FIG. 6 being formed, a gate insulating layer 115 is formed at a side of the gate electrode 114 away from the first insulating layer 105, the first via hole structure 116 penetrates through both the first insulating layer 105 and the gate insulating layer 115, and the second active layer 106 is electrically connected with the first active layer 104 through the first via hole structure 116. A second insulating layer 118 is formed between the second active layer 106 and the source-drain electrode layer 110. The second via hole structure 113 penetrates through the second insulating layer 118, and the source-drain electrode layer 110 is electrically connected with the second active layer 106 through the second via hole structure 113.

For example, upon the structure of the thin film transistor shown in FIG. 7 being formed, the manufacturing method differs from the processes shown in FIGS. 12A-12K in that the second gate electrode 108 is not directly formed after the second gate insulating layer 107 is formed, but the interlayer insulating layer 109 is directly formed; after forming the interlayer insulating layer 109, the source-drain electrode layer 110 and the second gate electrode 108 are formed in the same process step, and the second via hole structure 113 penetrates through the interlayer insulating layer 109 and the second gate insulating layer 107.

For example, the thin film transistor, the array substrate and the manufacturing method of the thin film transistor provided by the embodiments of the present disclosure have at least one of the following beneficial technical effects:

(1) The thin film transistor provided by at least one embodiment of the present disclosure has a double active layer structure, so that charges are accumulated on two surfaces of the two active layers respectively, so that the number of charges accumulated on the surfaces of the active layers is multiplied, and the on-state current of the thin film transistor is multiplied.

(2) The thin film transistor provided by at least one embodiment of the present disclosure further includes a third active layer, which further increases the on-state current of the thin film transistor.

(3) In the thin film transistor provided by at least one embodiment of the present disclosure, in the case that the material of the first active layer and the material of the second active layer are metal oxide semiconductor materials, a reducing gas can be used to reduce a part of the second active layer exposed to the second via hole structure to a simple metal, so that the resistivity of the second active layer becomes smaller, and then the overall resistance becomes smaller after the first active layer and the second active layer are electrically connected, that is, the resistance of the first active layer and the second active layer when they are connected can be reduced without adding new equipment and materials.

The following points need to be explained:

(1) The drawings of the embodiments of the present disclosure only refer to the structures related to the embodiments of the present disclosure, and other structures can refer to the general design.

(2) For the sake of clarity, in the drawings used to describe the embodiments of the present disclosure, the thickness of layers or areas is enlarged or reduced, that is, these drawings are not drawn to actual scale. It can be understood that when an element such as a layer, a film, a region or a substrate is said to be located "above" or "below" another element, the element may be located "directly" above or below another element, or there may be intervening elements.

(3) Without conflict, the embodiments of the present disclosure and the features in the embodiments can be combined with each other to obtain a new embodiment.

The above is only the specific implementation of the present disclosure, but the protection scope of the present disclosure is not limited thereto, and the protection scope of the present disclosure should be based on the protection scope of the claims.

The invention claimed is:

1. A thin film transistor, comprising:

a base substrate; and a first active layer, a first insulating layer and a second active layer, which are sequentially arranged on the base substrate;

wherein the first active layer is in contact with the second active layer through a first via hole structure located in the first insulating layer, and non-contacted portions of the first active layer and the second active layer are separated by the first insulating layer;

the thin film transistor further comprises a source-drain electrode layer, the source-drain electrode layer is electrically connected with the second active layer through a second via hole structure, an orthographic projection of the first via hole structure on the base substrate and an orthographic projection of the second via hole structure on the base substrate are at least partially overlapped, and at least a part of the source-drain electrode layer extends into the first via hole structure.

2. The thin film transistor according to claim 1, further comprising a first gate electrode and a second gate electrode, wherein the first gate electrode is at a side of the first active layer close to the base substrate, and a first gate insulating layer is arranged between the first gate electrode and the first active layer;

the second gate electrode is at a side of the second active layer away from the base substrate, and a second gate insulating layer is arranged between the second gate electrode and the second active layer.

3. The thin film transistor according to claim 2, wherein an interlayer insulating layer is arranged at a side of the second gate electrode away from the base substrate, the source- drain electrode layer is arranged at a side of the interlayer insulating layer away from the base substrate, and the second via hole structure sequentially penetrates through the interlayer insulating layer, the second gate insulating layer and a part of the first insulating layer.

4. The thin film transistor according to claim 3, further comprising a third active layer, wherein the third active layer is arranged at a side of the second gate electrode away from the base substrate, the interlayer insulating layer is arranged between the third active layer and the second gate electrode, and the third active layer is electrically connected with the source-drain electrode layer.

5. The thin film transistor according to claim 1, further comprising a gate electrode, wherein the gate electrode is between the first active layer and the second active layer.

6. The thin film transistor according to claim 5, wherein a gate insulating layer is arranged at a side of the gate electrode away from the first insulating layer, and the first via hole structure penetrates through both the first insulating layer and the gate insulating layer.

7. The thin film transistor according to claim 6, wherein a second insulating layer is arranged between the second active layer and the source-drain electrode layer, and the second via hole structure penetrates through the second insulating layer.

8. The thin film transistor according to claim 2, wherein the source-drain electrode layer and the second gate electrode are arranged on a same layer, an interlayer insulating layer is arranged at a side of the second gate electrode close to the base substrate, and the second via hole structure sequentially penetrates through the interlayer insulating layer, the second gate insulating layer and a part of the first insulating layer.

9. The thin film transistor according to claim 1, wherein the first active layer comprises a first sub-active layer and a second sub-active layer which are stacked, and/or the second active layer comprises a third sub-active layer and a fourth sub-active layer which are stacked.

10. An array substrate, comprising the thin film transistor according to claim 1.

* * * * *